United States Patent [19]

Koch

[11] Patent Number: 4,980,133
[45] Date of Patent: Dec. 25, 1990

[54] APPARATUS COMPRISING HEAT PIPES FOR CONTROLLED CRYSTAL GROWTH

[75] Inventor: Mark E. Koch, Farmer's Branch, Tex.

[73] Assignee: LTV Aerospace & Defense Company, Dallas, Tex.

[21] Appl. No.: 168,685

[22] Filed: Mar. 16, 1988

[51] Int. Cl.⁵ ............................................. C30B 35/00
[52] U.S. Cl. ................................ 422/245; 156/616.1; 156/616.4; 165/47
[58] Field of Search ......................... 422/245; 165/47; 156/616.1, 616.4

[56] References Cited

U.S. PATENT DOCUMENTS

| | | | |
|---|---|---|---|
| 3,677,329 | 7/1972 | Kirkpatrick | 165/105 |
| 3,770,047 | 11/1973 | Kirkpatrick et al. | 164/338 |
| 3,857,990 | 12/1974 | Steininger et al. | 165/104.26 |
| 4,007,369 | 2/1977 | Dietze | 219/390 |
| 4,093,839 | 6/1978 | Moliterno et al. | 219/8.5 |
| 4,347,431 | 8/1982 | Pearce et al. | 219/390 |
| 4,423,516 | 12/1983 | Mellen, Sr. | 373/111 |
| 4,544,025 | 10/1985 | Aldrich et al. | 165/65 |
| 4,545,848 | 10/1985 | Lehoczky et al. | 156/616.4 |
| 4,681,995 | 7/1987 | Ahern et al. | 165/1 |
| 4,783,320 | 11/1988 | Adamski | 422/245 |
| 4,863,553 | 9/1989 | Lehoczky et al. | 156/616.4 |

OTHER PUBLICATIONS

D. E. Cox & F. K. Fong, "Growth of Single Crystals of Anhydrous Lanthanide Halides", Journal of Crystal Growth, vol. 20, 1973, pp. 233-238.

Primary Examiner—Melvyn J. Andrews
Attorney, Agent, or Firm—Arnold, White & Durkee

[57] ABSTRACT

This invention provides a method and apparatus for controlled crystal growth. The apparatus involves two tandemly aligned heat pipes separated by a conductive sleeve. The heat pipes establish two different isothermal temperature zones while the sleeve defines a gradient zone. A crystallization zone is located in this gradient zone. The method for controlled growth of a crystal involves lowering an ampoule through the gradient zone at an effective rate.

13 Claims, 2 Drawing Sheets

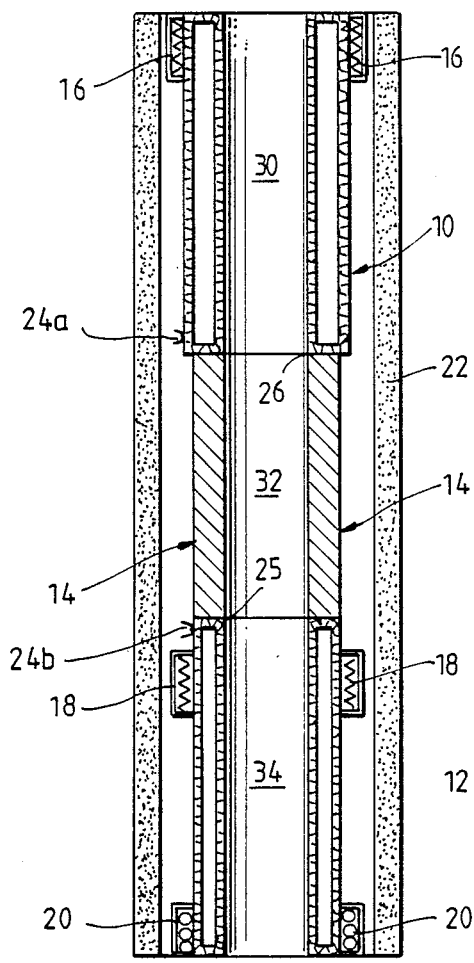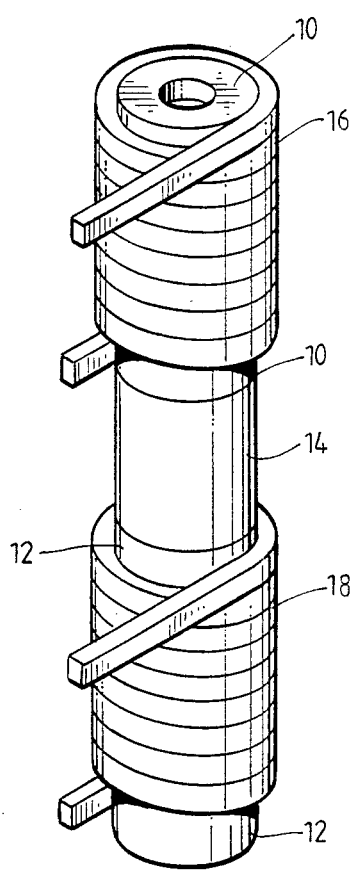

APPARATUS COMPRISING HEAT PIPES FOR CONTROLLED CRYSTAL GROWTH

BACKGROUND OF THE INVENTION

The present invention pertains broadly to a system for processing a material through a zone which is marked by a controlled temperature along its length. The system is particularly applicable to crystallization, especially the formation of single crystals by freezing liquid melts or by solid state recrystallization of polycrystalline materials.

Crystals have applications in various fields, including semiconductors, thin films, and lasers. Several different materials fall under the term "crystal". Certain crystals may be amorphous, such as glass. Other crystals are called "polycrystals" because they actually include more than one crystal. Still others fall under the "single crystal" classification. Quality control of the latter is of particular concern, because of the need to minimize defects that would impair single crystal performance in industrial applications.

In a general aspect, single crystals can be formed by either freezing a liquid or by heating and cooling a polycrystalline mass. Defects in the resulting crystal or crystals often occur when the cooling is uncontrolled. For example, stresses may develop when forming the crystalline structure due to excessive temperature differences maintained along the length of the crystal during the cooling process.

Basically, crystal defects are departures in a crystalline solid from a regular array of atoms or ions. Natural crystals, for example, usually contain numerous defects due to the uncontrolled conditions under which they were formed. Defects which affect the color sometimes make these natural crystals valuable as gems. However, with synthetic crystals, defects in general are to be avoided.

The number of defects in a crystal can usually be reduced by cooling the crystal uniformly and slowly. One fairly common method of growing single crystals is called the Bridgeman-Stockbarger growth process, wherein the material is melted in a vertical cylindrical vessel which tapers conically to a point at the bottom. The vessel (ampoule) is lowered slowly into a cold zone, i.e., a zone having a temperature below the melting point. Crystallization begins in the tip and continues usually by growth from the first formed nucleus.

A modified version of this method is discussed in D. Cox & F. Fong, "Growth of Single Crystals of Anhydrous Lanthanide Halides," *J. Crystal Growth*, Vol. 20, 1973 pp. 233-238, hereby incorporated by reference. This procedure employs a furnace having dual temperature zones. A hot zone is established at one end of the furnace, and a lower temperature zone is established at the other end. The feed material is crystallized as it is lowered at a controlled rate from the hot zone to the cooler zone. The temperature gradient near the crystal melting temperature is particularly important in the crystal growth process.

The dual temperature furnace, discussed by Cox and Fong, may be constructed by attaching a high temperature heating element, e.g., a coil, at one end of a ceramic oven or furnace and a lower temperature heating element at the opposite end. Because heat is allowed to escape at both ends, a rough thermal gradient along the length of the furnace can be established. Nevertheless, the temperature of the furnace generally needs to be closely monitored to adequately control the gradient. This can involve complex temperature sensing circuitry and adjustments of the electrical power input. More conventionally, furnaces do not provide for precise temperature control of the gradient Moreover, most furnaces possess large thermal masses, resulting in long equilibration times.

Accordingly, there exists a continuing need for a material processing system which is capable of readily reaching and maintaining a desired equilibrium temperature gradient or profile. It is further desirable that the system be relatively simple and dependable. The need for such a system exists especially in crystallization operations; however, similar needs are evident in chemical reactions and other important industrial operations.

SUMMARY OF INVENTION

The present invention in general terms comprises apparatus and methods for processing materials wherein a controlled, sharply defined thermal gradient zone is established between two temperature zones which are maintained at two different temperatures (end temperatures) and separated by the thermal gradient zone.

The thermal gradient zone is configured or designed such that the two different end zone temperatures constitute the limiting temperatures of the thermal gradient. Further, the end zone temperatures and the thermal gradient zone are configured or selected such that a desired operating or processing temperature lies at an intermediate point in the thermal gradient Thus, a material to be processed at the desired temperature is passed through one of the end thermal zones and thence through the thermal gradient zone and the other end thermal zone. In the course of such passage, the material is cooled or heated to the desired processing temperature within the thermal gradient.

In a preferred aspect of the invention, the two end zones are designed to be substantially isothermal along their respective lengths, and the thermal gradient zone is configured or designed to provide a substantially constant thermal gradient or change in temperature per unit length along the length of this zone. The specific design or configuration in any given situation will depend on factors such as the two end zone temperatures, the conductivity of the thermal gradient zone, the mass flow of the material being processed, the nature of the processing action, itself, etc.

In a preferred form of the invention, the two end thermal zones may be cylindrical heat pipes, and the thermal gradient zone may comprise a thermally conductive sleeve configured to provide the desired thermal gradient between the two end temperatures. As is well known, heat pipes have extremely high thermal conductivities and operate at substantially constant temperatures. When two such isothermal heat pipes are separated a specific distance ("d") by a sleeve having an appropriate thermal conductivity ("k"), a controlled temperature gradient tailored to include a particular processing temperature may be established within the sleeve.

The invention has particular application to operations such as crystallization where the rate at which a substance is cooled to a crystallization temperature can be very important in minimizing defects and achieving proper crystal growth. Thus, a material to be crystallized at a particular temperature may be lowered sequentially through three zones -- an input isothermal zone, a crystallization zone, and an output isothermal zone. The three zones abut one another end-to-end such that heat can flow through the gradient zone from the input zone to the output zone Further, the input zone is maintained at a temperature sufficiently higher than the output zone such that a desired thermal gradient is established along the crystallization zone which includes the crystallization temperature.

It will be recognized that the several zone temperatures and the conductivity of the crystallization zone are important considerations for any given crystallization or other operation. In the description that follows, the handling of these and other considerations will be treated to explain how the considerations must be taken into account Modifications of the basic considerations will also be treated. Thus, it may be desirable in some instances to block outward or radial heat flux from the gradient zone by means of insulation or other heat shields. It may also be desirable in some instances to remove heat from the output or cooler zone, as the case may be, to help induce a desired net heat flux between the two end isothermal zones.

BRIEF DESCRIPTION OF THE DRAWINGS

FIG. 1 is a sectional side view of a preferred embodiment of the present invention.

FIG. 2 is a perspective view of an embodiment of the present invention.

DETAILED DESCRIPTION OF A PREFERRED EMBODIMENT

Figure 3:
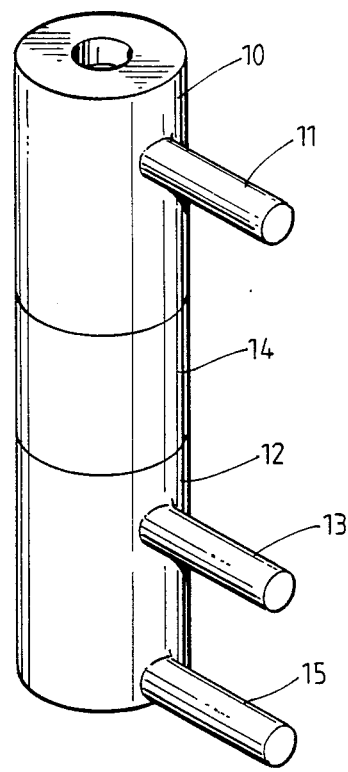
FIG. 3 is a perspective view of an embodiment having heat pipe side arms.

Referring to FIG. 1, there is shown a preferred embodiment such as might be used to crystallize a substance at a temperature between about 600° C. and about 1000° C. In this instance, the invention provides an apparatus comprising at least two members in the form of cylindrical heat pipes 10, 12 tandemly aligned with one another and constituting two furnace zones 30 and 34, respectively. Disposed between the heat pipes 10, 12 is a thermally conductive cylinder or sleeve 14 made of a thermally conductive material. Surrounding the heat pipes and sleeve is a heat shield 22.

Each heat pipe 10, 12 has its own heater 16, 18 which helps establish the furnace zone temperatures. The upper heater 16 helps establish and control the high temperature furnace zone 30, while the lower heater 18 helps establish the lower temperature furnace zone 34. By using heat pipes as the heat members, the heaters are able to achieve substantially constant temperatures The cooling means 20 is also usually essential for helping temperature maintenance of the lower temperature furnace zone 34.

An advantage of the embodiment illustrated in FIG. 1 is that a controlled heat gradient can be established and maintained along the length of the sleeve 14 without temperature sensing or power manipulation. The slope of the gradient is determined by the known isothermal temperatures of the two heat pipes 10, 12; the contact between the heat pipes 10, 12 and the conductive sleeve 14 at the interfaces 26, 28; the conductivity ("k") of the sleeve material; the separation distance or length ("d") of the sleeve 14 separating the two heat pipes 10, 12; and the cross-sectional area of the conductive sleeve ("A").

In the specific embodiment of the invention illustrated in FIG. 1, crystals are grown by lowering an ampoule containing a crystalline forming material from the upper heat pipe 10 through the sleeve 14 to the lower heat pipe 12. Crystals can be grown in any suitable container, and one inch diameter quartz ampoules are contemplated for many applications. Generally suitable heat pipes are flat-bottomed cylindrical sodium heat pipes supplied by Thermacore, Inc., 780 Eden Road, Lancaster, Pa. 17601. An example of such a sodium heat pipe would have 1.218" inner diameter (3.09 cm) for the inner tube and 2.32" (5.89 cm) outer diameter for the outer tube. This would yield a cross-sectional area ("A") of about 19.76 cm$^2$ for each cylindrical heat pipe. While the amount of cross-sectional area is generally not critical, it should be large enough to provide sufficient heat flux across the interface 26, 28 to create the desired gradient along the length of the sleeve 14.

The two heat pipes 10, 12 should be maintained at substantially constant, but different, temperatures above and below the crystallization temperature. The temperature differential allows heat to move axially (in the same direction as the movement of the crystal) by conduction through the conductive sleeve material from the first heat pipe 10 to the second heat pipe 12.

Because of their enormous thermal conductivity, heat pipes are substantially isothermal along their entire length. Conventional heat pipes, for example, often have thermal conductivities several thousand times greater than copper rods of the same dimensions. Accordingly, in the preferred embodiment illustrated in FIG. 1, the high temperature heat pipe 10 helps establish one isothermal zone 30 while the lower temperature heat pipe 12 helps establish a second isothermal zone 34.

For operations in the temperature range contemplated for the embodiment of FIG. 1, each heat pipe 10, 12 illustrated in FIG. 1 may be a sodium-filled heat pipe made from Incalloy 800H and lined with stainless steel mesh. Incalloy is a metal which survives well at elevated temperatures in air. Thus, such a device would be appropriate for Bridgeman crystal growth for crystals freezing within the range of 600° C. to 1000° C. A typical power loading capability for an Incalloy heat pipe is about 20 w/cm$^2$. It should be noted, however, that other heat pipes can go as high as 200 w/cm$^2$.

The central passageway in each heat pipe 10, 12 defines the furnace zones 30, 34 into which a crystalline-forming substance may be introduced. As noted above, a working fluid such as sodium is sealed in the annular space between the outside wall of the heat pipe and the inside wall. Also as noted above, each heat pipe may be lined with a stainless steel mesh or other wicking structure. In any case, heat conduction is via evaporation and subsequent condensation of the working fluid. Because the heat of evaporation and condensation are substantially equal, each heat pipe 10, 12 is effectively clamped to an operating temperature which is essentially determined by the flow of heat into and out of the pipe. Return of the working fluid from the condenser area to the heat input point is aided by capillary action of the mesh or wick material lining the pipe. Depletion of the working fluid in the evaporator section of the heat pipes is thereby alleviated or avoided.

As mentioned earlier, a variety of heat pipes are workable within the scope of the invention. They are designed with a number of factors in mind, including dimensions, geometries, and materials. Materials may be selected based on operating desired temperature ranges, and surface power loading and structural load bearing requirements. In the preferred embodiment of FIG. 1, each heat pipe 10, 12 is a cylindrical heat pipe having a passageway that is of sufficient diameter to define a furnace zone 30, 34 and provide for the passage of crystal growth ampoules.

Normally, the heat pipes 10, 12 will have a significantly higher conductivity than the sleeve 14. In this manner, a precisely defined temperature profile can be established along the gradient zone 32. Essentially, the gradient can be restricted to the area between two predetermined points, e.g., the interfaces 26 and 28.

In a preferred aspect, the input and output zones of the system of the invention are maintained at temperatures which are isothermal and independently fixed or controlled. Isothermal conditions can be established through the use of heat pipes. Independence can be achieved by heating the zones with separate heating devices, e.g., heating coils. Independent temperature control is available through factors such as controlled heating and controlled material flow. Thus, each heat pipe is preferably provided with its own separate heating and/or cooling means. Referring to FIG. 1, the high temperature heat pipe 10 of the preferred embodiment shown there is equipped with a first heater or heating means 16 while the low temperature heat pipe 12 is equipped with both a second heater or heating means 18 and a cooler or cooling means 20.

Conventional heating devices may be employed as the heater elements 16, 18. A preferred example of such elements are hemicylindrical resistive heater elements available from the Lindberg Corporation, 304 Hart Street, Watertown, Wis. 53094. Preferably, the heating elements 16, 18 are positioned a sufficient distance away from the conductive sleeve 14 so as not to interfere with the temperature profile or gradient along the sleeve.

The use of a cooling means 20 can also be important in some instances, because it can help provide for the controlled removal of heat from the low temperature heat pipe 12 or for quickly lowering the temperature of this heat pipe. The cooling means or cooler 20 may be a cooling tube assembly as illustrated in FIG. 1, or it may be any other suitable device such as a fin assembly that permits heat to be transferred from the lower heat member or from the bore of the lower temperature heat pipe to the environment. In some instances, the use of a cooler or cooling means 20 is helpful in keeping the temperature of the bore of the apparatus from reaching a constant value, i.e., where there would be no gradient.

FIG. 2 illustrates another specific embodiment of the present invention wherein the heating elements 16, 18 are themselves linear heat pipes coiled around the furnace zone heat pipes 10, 12. In this embodiment, the linear heat pipes are separate from the furnace zone heat pipes. That is, although they are in close contact with each other, they do not share the same working fluid or annular space. In such an embodiment, the temperatures of isothermal furnace zones can be controlled to a high degree because of the high conductivity between the linear heat pipes 16, 18 and the cylindrical or furnace-zone heat pipes 10, 12.

FIG. 3 illustrates yet another specific embodiment of the invention, wherein the furnace heat pipes 10, 12 include at least one, and preferably more than one, side arm. The side arms should be part of the heat pipes themselves. That is, they share common liquid and vapor spaces. These side arms act as the means for adding and removing heat to and from the furnace heat pipes. They are each connected to an external heating or cooling source.

In the embodiment shown in FIG. 3, the upper heat pipe, i.e., the heat pipe defining the high temperature zone, must include a first side arm 11. For the lower heat pipe, the side arms 13, 15 are a preferred feature, and in some cases are not required. However, the apparatus must include a means for removing heat from the lower heat pipe to provide a temperature gradient between the upper and low heat pipes 10, 12. A second side arm 13 in the lower heat pipe for removing heat is one way to accomplish this. A third side arm 15 in the lower heat pipe may also be included for additional controllability of the lower heat pipe temperature, e.g., to add heat in the appropriate amount to the lower heat pipe.

Referring back to FIG. 1, temperature sensing of the heat pipes 10, 12 can be accomplished by thermocouples 24a, 24b welded or otherwise attached to the outer heat pipe surfaces. If a heat shield 22 is provided, the thermocouples 24 can be fed through small holes in the heat shield 22.

In contrast to the heating elements 16, 18, the thermocouples 24a, 24b are placed as close as possible to the interfaces 26, 28 between the heat pipes 10, 12 and the conductive sleeve 14. This generally provides better temperature monitoring of the heat pipes 10, 12 at the interfaces 26, 28. The signals from the thermocouples 24a, 24b may be fed back to temperature controllers, not shown, which in turn control power relays in line with primaries of 120 VAC down converting transformers. The transformers should be matched to the operating characteristics of the furnaces to which they pertain. Suitable temperature controllers are available from Omega Engineering, Inc., One Omega Drive, Box 4047, Stamford, Conn. 06907. A wide variety of temperature control loops may also be used in accordance with this invention. Alternatively, the pressure of a buffer gas may be controlled thereby controlling heat pipe operating temperature. Such gas loaded heat pipes are adequately described in any text on heat pipes.

As stated earlier, another important aspect of the invention lies in the conductive sleeve 14. The sleeve 14 is preferably a hollow cylinder made of a material having sufficiently high conductivity to transfer the heat from one heat pipe through the gradient zone defined by the sleeve to the second heat pipe at an effective rate. Clearly, a sleeve made of insulative material would be less effective for transferring heat. Yet, in order to establish a sharply defined gradient zone, the conductive sleeve must have a lower conductivity than the heat pipes.

In specific embodiments of the invention, the conductive sleeve will have an "effective length" for the operation being carried out, e.g., crystal growth. That is, it will be long enough to provide a controlled gradient zone for the crystalline materials to form. Normally, the gradient zone will have a substantially linear temperature profile for materials moving axially through the sleeve.

Generally speaking, the effective length, the conductivity, and the effective heat flux for the gradient zone is selected according to the type of material processed and the speed at which the material is passed through the gradient zone. For Bridgeman growth of lanthanum chloride crystals, for example, a preferred gradient is about 70° K. over 5 cm. Thus, the sleeve should be about 5 cm long, the upper or input zone temperature about 880° C., the lower or output zone temperature about 810° C., and the rate for the crystal to be dropped through the sleeve preferably about 4.8 mm/hour. The melting or crystallization point of the material should correspond to approximately halfway along the length of the sleeve. In the case of lanthanum chloride, the input temperature is about 20° C. above its melting point, and the output temperature is about 50° C. below the melting point. The values of these parameters are discussed in the article by Cox and Fong.

Alumina is usually a suitable material for the conductive cylinder sleeve 14 in operations of the type shown in FIG. 1, because of its sufficiently high specific heat and thermal conductivity K of approximately 10 watts/m° K. Assuming the alumina sleeve 14 has the same cross-section as the cylindrical heat pipes 10, 12, the theoretical total heat flux, $\Phi$, over the cylinder can be described by the equation $$\Phi = K\Delta T/d$$

where d is the length of the cylindrical sleeve 14 and $\Delta T$ is the difference between the upper furnace zone 30 and the lower furnace zone 34 temperatures. Accordingly, the flux for the 5 cm long alumina sleeve in the case of the lanthanum chloride example mentioned above is about 1.4 watts/cm². According to the above equation, then, the total power flowing from the upper heat pipe through its edge is about 27.7 watts. Although materials other than alumina may be used in this example, they should not exceed the heat flow limitation of the heat pipe, which in the case of the sodium-filled Incalloy tubes is conservatively rated at about 20 w/cm².

In a general aspect, good thermal contact between the heat pipes and the conductive sleeve is important for providing a sharp transition between the heat pipes and the sleeve. This can usually be accomplished by providing smooth surfaces at the ends of the conductive sleeve and the corresponding contacting end of each heat pipe.

In a preferred embodiment, outward radial heat flux is blocked by an insulator such as a heat shield 22 to maximize axial heat flux, minimize radial heat flux, and help provide a controlled temperature profile between the two isothermal temperatures.

A preferred embodiment of the invention also comprises a high impedance heat shield 22 surrounding the heat pipes 10, 12 and sleeve 14. Without being bound by theory, it is believed that a conductive sleeve that is surrounded by an insulator is essential for a good temperature profile. With a heat shield 22, heat can be prevented from escaping outwardly from the conductive sleeve. In this manner, heat should be able to flow from one isothermal zone to the next without substantial radial dissipation to the environment. It also tends to reduce the power load on the heat pipes 10, 12.

Conventional heat shields are available for use in the invention. One example is a cylinder composed of alternating metal reflectors and air gaps with loose dielectric fiber fill to minimize convective air heat transfer. An evacuated region may be substituted for the air gaps to provide a dewar-type insulator region which may improve the insulative properties of the heat shield when used with the metal reflectors. The metal reflectors in high temperature service may be made of Incalloy.

In order to grow crystals by the Bridgeman process, the apparatus of the invention should be positioned vertically so that a crystal can be lowered down through the gradient zone 32 defined by the sleeve 14. The crystalline material melted in the upper thermal zone is lowered axially an effective distance through the gradient zone. Usually, this is done at an extremely slow rate. As it passes through the gradient zone, the substance crystallizes.

Another specific aspect of the invention provides a method for growing crystals involving careful control of the processing temperature. The steps include: (a) maintaining two thermal zones in axial alignment and at two different, substantially constant temperatures, one above the melting point and one below the melting point; separating and contacting the thermal zones with a gradient zone which includes conductive means for moving heat axially from the upper temperature zone to the lower temperature zone; and (c) moving a crystal through the gradient zone from the upper temperature zone to the lower temperature zone.

The steps may also include blocking outward radial heat flux along the gradient zone with a heat shield or insulator and removing heat from the lower temperature zone by a cooler or heat dissipation device to help provide a net heat flux from the upper temperature furnace zone to the lower temperature furnace zone.

Figure 4:
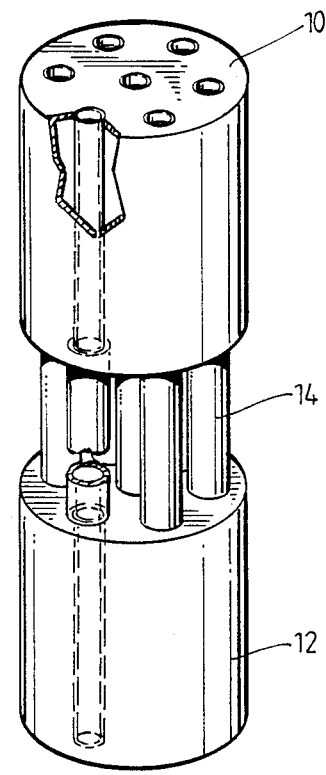
FIG. 4 is a perspective partial cutaway view of a multibore embodiment of the present invention.

Although a single gradient zone corresponding to the conductive sleeve 14 is shown in FIG. 1, an alternative embodiment includes more than one gradient zone. For example, in the embodiment shown in FIG. 4, the sleeves 14 are mounted in parallel with each other and tandemly aligned with the heat pipes 10, 12. Each sleeve 14 defines a gradient zone. In this manner, several crystals may be grown at once using the same heat pipe configuration. If the same heat pipes, conductive material, geometry, and dimensions are used for all of the sleeves 14, substantially identical temperature profiles may be developed in the different sleeves for growing several crystals at the same time.

It will be apparent, of course, that many modifications may be made in the above-described embodiments without departing from the scope of the invention, which is defined by the claims below. For example, the linear heat pipes shown in FIG. 2 may be replaced by cylindrical heat pipes to encase the first pair of heat pipes 10, 12.

Likewise, a device within the scope of this invention may include several gradient zones having different thermal profiles. For example, an apparatus may include two gradient furnace zones. This may be accomplished by providing a third heat pipe having a cooler such as cooling fins or a cooling jacket tandemly connected to a second sleeve. The second sleeve may be tandemly connected to one of the heat pipes, e.g., the lower temperature heat pipe. Using this device, the material being processed may be moved relative to all the temperature zones. This device could provide gentle cooling of a crystal to room temperature. A single gradient apparatus as shown in FIG. 1 may also be used to provide such gentle cooling. In that case, the cooling process comprises stopping the descent of the crystal in the second isothermal zone and slowly removing heat from that zone to provide isothermal cooling of the crystal.

What is claimed is:

1. An apparatus for growing single crystals, comprising two co-axially aligned cylindrical heat pipes in thermal contact with and separated by a cylindrical, thermally conductive sleeve for transferring heat from one heat pipe to the other heat pipe said thermally conductive sleeve providing a heat flux of at least about 1.4 watts/cm$^2$.

2. An apparatus for processing a crystalline material at a given temperature, comprising:
  two co-axially aligned, isothermal heating pipes separated by a thermally conductive sleeve, each heating pipe capable of being heated to a different temperature and defining a separate furnace zone;
  said heating pipe and said sleeve having a common passageway to provide for the passage of a material from one furnace zone through the sleeve to the other furnace zone; and wherein
  the sleeve has sufficient length to provide for a substantially linear thermal gradient, including the given temperature, along the length of the sleeve, and is of sufficiently high conductivity to provide for effective axial heat flux from the high temperature isothermal member to the low temperature isothermal pipe said thermally conductive sleeve providing a heat flux of at least about 1.4 watts/cm$^2$.

3. An apparatus as recited in claim 2 for growing a single crystal, wherein:
  one of the furnace zones is capable of operating at a temperature above the given temperature, and
  the other furnace zone is capable of operating at a temperature below the given temperature.

4. An apparatus for growing crystals, comprising:
  two co-axially aligned heat pipes defining separate axial furnace zones capable of reaching different temperatures; and
  a heat conductive sleeve having two ends and defining a gradient zone for receiving crystals to be moved from one end of the sleeve through to the other end of the sleeve;
  said sleeve interposed between and connected to said pipes to define a continuous heat path;
  said heat sleeve having a lower thermal conductivity than said heat pipes said heat conductive sleeve providing a heat flux of at least about 1.4 watts/cm$^2$.

5. An apparatus for processing a crystal, comprising:
  two tandemly aligned, cylindrical heat pipes, the first heat pipe capable of attaining a temperature above the melting point of the crystal, the second heat pipe capable of attaining a temperature below the melting point of the crystal;
  a cylindrical alumina sleeve disposed in alignment between the heat pipes said cylindrical alumina sleeve providing a heat flux of at least about 1.4 watts/cm$^2$;
  a means for lowering the crystal through the first heat pipe and sleeve and into the second heat pipe;
  a separate heater connected to each heat pipe for setting the temperature of its respective heat pipe;
  a means of removing heat from each heat pipe;
  temperature sensing means for determining the temperature of each heat pipe; and
  a heat shield around the sleeve to reduce the outward radial flow of heat.

6. An apparatus for processing a crystal, comprising:
  two tandemly aligned, cylindrical heat pipes, each having different temperatures;
  a conductive sleeve defining a furnace zone and disposed between the two heat pipes for conducting heat from the higher temperature heat pipe to the lower temperature heat pipe said conductive sleeve providing a heat flux of at least about 1.4 watts/cm$^2$; and
  a first side arm extension to the higher temperature heat pipe for supplying heat from a heat source to the higher temperature heat pipe.

7. An apparatus as recited in claim 6 additionally comprising:
  a second side arm extension to the lower temperature heat pipe for removing heat from the lower temperature heat pipe.

8. An apparatus as recited in claim 7 additionally comprising:
  a third side arm extension to the lower temperature heat pipe for supplying heat from a heat source to the lower temperature heat pipe.

9. Apparatus for crystallizing a material which is crystallizable at a given temperature, comprising:
  first and second cylindrical, axially aligned heat pipes;
  a thermally conductive, cylindrical sleeve axially aligned with and positioned between the heat pipes to define a continuous passageway through the heat pipes and the sleeve for flow of the material, the sleeve having a thermal conductivity less than the heat pipes and contacting the heat pipes to provide a continuous heat path along the heat pipes and the sleeve said sleeve providing a heat flux of at least about 1.4 watts/cm$^2$; and
  an independent, controlled source of heat for each heat pipe.

10. The apparatus of claim 9, including cooling means adapted to remove heat from the downstream heat pipe relative to the flow direction of the material through the heat pipes and the sleeve.

11. The apparatus of claim 9, including a heat shield around the sleeve to reduce radial flow of heat from the sleeve.

12. The apparatus of claim 9, wherein the sleeve comprises alumina.

13. The apparatus of claim 9, wherein sodium filled heat pipes are utilized.

* * * * *